United States Patent
Lee et al.

(10) Patent No.: US 7,369,254 B2
(45) Date of Patent: May 6, 2008

(54) SYSTEM AND METHOD FOR MEASURING DIMENSION OF PATTERNS FORMED ON PHOTOMASK

(75) Inventors: Dong-Gun Lee, Hwaseong-si (KR);
Seong-Woon Choi, Suwon-si (KR);
Sang-Yong Yu, Yongin-si (KR);
Seong-Yong Moon, Yongin-si (KR);
Byung-Gook Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 228 days.

(21) Appl. No.: 11/151,742

(22) Filed: Jun. 13, 2005

(65) Prior Publication Data

US 2006/0066878 A1   Mar. 30, 2006

(30) Foreign Application Priority Data

Jun. 14, 2004   (KR)  ................. 10-2004-0043651
Apr. 20, 2005   (KR)  ................. 10-2005-0032824

(51) Int. Cl.
*G01N 21/00* (2006.01)
(52) U.S. Cl. .................. 356/625; 356/630; 356/351; 356/432; 438/710; 250/559.19
(58) Field of Classification Search ........ 356/625–640, 356/432–435, 302, 303, 306, 237.2–237.5, 356/445, 448
See application file for complete search history.

(56) References Cited

U.S. PATENT DOCUMENTS 5,176,731 A * 1/1993 Prast et al. ............... 65/485
5,739,909 A * 4/1998 Blayo et al. .............. 356/369
5,880,838 A * 3/1999 Marx et al. ............... 356/498
6,031,614 A * 2/2000 Michaelis et al. ......... 356/369
6,750,961 B2 * 6/2004 Niu et al. ................ 356/237.5

(Continued)

FOREIGN PATENT DOCUMENTS

JP         10-254118        9/1998

(Continued)

OTHER PUBLICATIONS

Budd, R.A., D.B. Dove, J.L. Staples, R.M. Martino, R.A. Ferguson, J.T.Weed, "Development and application of a new tool for lithographic mask evaluation, the stepper equivalent Aerial Image Measurement System, AIMS-Reference" IBM Journal of Research and Development, vol. 41, Nos. 1/2 1997.*

(Continued)

*Primary Examiner*—Layla G. Lauchman
*Assistant Examiner*—Rebecca C Slomski
(74) *Attorney, Agent, or Firm*—F. Chau & Associates, LLC

(57) ABSTRACT

A system for measuring dimension of photomasks comprises a light source emitting measuring light having a wavelength, a transmission detector for receiving the measuring light, a stage on which a photomask having circuit patterns is placed, the stage being disposed between the light source and the transmission detector, and a controller having a dimension-deciding algorithm to determine a dimension of the circuit patterns from a spectroscopic characteristic of the received measuring light, the controller being connected to the transmission detector.

17 Claims, 7 Drawing Sheets

U.S. PATENT DOCUMENTS

| | | | |
|---|---|---|---|
| 2002/0030826 A1* | 3/2002 | Chalmers et al. | 356/630 |
| 2005/0002020 A1* | 1/2005 | Inoue et al. | 356/237.1 |
| 2005/0153564 A1* | 7/2005 | Mak et al. | 438/710 |

FOREIGN PATENT DOCUMENTS

| | | |
|---|---|---|
| JP | 11-304719 | 5/1999 |
| JP | 2002-156741 | 5/2002 |
| JP | 2003-101003 | 4/2003 |
| KR | 1999-004117 | 1/1999 |
| KR | 2000-0013606 | 3/2000 |

OTHER PUBLICATIONS

Kallioniemi, J. Saarinen, and E. Oja, "Optical Scatterometry of Subwavelength Diffraction Gratings: Neural-Network Approach," Appl. Opt. 37, 5830-5835 (1998)☐☐http://www.opticsinfobase.org/abstract.cfm?URI=ao-37-25-5830.*

* cited by examiner

SYSTEM AND METHOD FOR MEASURING DIMENSION OF PATTERNS FORMED ON PHOTOMASK

CROSS-REFERENCE TO RELATED APPLICATIONS

This application claims priority to Korean Patent Application No. 2004-43651, filed on Jun. 14, 2004 and Korean Patent Application No. 2005-32824, filed on Apr. 20, 2005, the disclosures of which are incorporated herein in their entirety by reference.

BACKGROUND OF THE INVENTION

1. Technical Field

The present disclosure relates to a system and method for measuring semiconductor patterns, and more particularly to a system and method for measuring a dimension of patterns formed on a photomask.

2. Discussion of Related Art

A fabricating process of semiconductor integrated circuits includes photolithography for transferring a circuit pattern formed on a photomask onto a photoresist layer coated on a wafer. A photoresist pattern formed using photolithography is used as a mask for etching an underlying material layer. A critical dimension (CD) of the photoresist pattern on the wafer is a factor to determine an integration density of semiconductor devices. The integration density affects the prices of the semiconductor devices. Thus, reduction of a CD of the wafer photoresist pattern has been studied.

Since a linewidth uniformity of the photoresist pattern on the wafer affects a yield of semiconductor devices, various technologies have been suggested for improving the linewidth uniformity as the demand for smaller and denser integrated circuits (ICs) increases. Since the photoresist pattern on the wafer is the result of transfer using photolithography, shapes and characteristics of the photoresist pattern on the wafer are affected by shapes and characteristics of a corresponding photomask. Due to a non-linear characteristic during the transfer, a linewidth of the photoresist pattern on the wafer varies at a higher reduction ratio than a reduction ratio of transfer. Thus, a photomask used in photolithography needs to pass a test including factors such as linewidth uniformity.

Conventionally, an image of a pattern or a reflective spectrum reflected from the pattern is used in measuring a linewidth uniformity of the photomask. A method using the image is illustrated in FIG. 1. Referring to FIG. 1, after an image 10 is displayed on an optical device such as a monitor, a pattern dimension is measured using the phenomenon that a brightness (or luminance) of the image varies at a boundary of the pattern. Since a measurement error is determined by a photographing resolution, a photographing method using a resolution to distinguish pattern dimensions smaller than a required measurement error is needed. To achieve a high resolution, the method using the image 10 employs a scanning electron microscope (SEM).

Although circuit patterns are designed with the same shape, their dimensions may vary based on their locations. Accordingly, a large number of measurements are needed to obtain an accurate measuring result. The measuring method using SEMs has a non-negligible measurement error and requires long measuring time. Thus, increased time and cost are needed for obtaining an accurate measuring result.

Another conventional method using a reflective spectrum is illustrated in FIG. 2. Referring to FIG. 2, the method includes using reflective spectrum-pattern dimension data prepared from design data of the photomask to indicate a relationship between a reflective spectrum and a pattern dimension. Since the reflective spectrum is the result of a complex reflection procedure, valid reflective spectrum-dimension data based on a theoretical access may be obtained only in limited cases (e.g., regularly repeated linear patterns shown in FIG. 3). Therefore, an empirical method is needed to obtain valid reflective spectrum-dimension data for patterns of complex shapes, as shown in FIG. 4 or FIG. 5.

The empirical method includes, for example, determining the reflective spectrum-dimension data using a different test mask. However, the empirical method is incapable of generating valid reflective spectrum-dimension data if pattern shapes are too complex. As a result, methods using the reflective spectrum are used in a photomask having circuit patterns which are as simple as shown in FIG. 3 (e.g., ISO mask for defining an active region).

SUMMARY OF THE INVENTION

Exemplary embodiments of the present invention provide dimension measuring systems and methods for precisely measuring the dimension of patterns formed on a photomask at a high speed.

According to an embodiment of the present invention, a system for measuring a dimension of photomasks comprises a light source emitting a measuring light having a wavelength, a transmission detector for receiving the measuring light, a stage on which a photomask having circuit patterns is placed, the stage being disposed between the light source and the transmission detector, and a controller having a dimension-deciding algorithm to determine a dimension of the circuit patterns from a spectroscopic characteristic of the received measuring light, the controller being connected to the transmission detector.

According to an embodiment of the present invention, a system for measuring a dimension of photomasks comprises a light source emitting a measuring light having a wavelength, a transmission detector for receiving the measuring light, a stage on which a photomask having circuit patterns is placed, the stage being disposed between the light source and the transmission detector, a first optical device disposed between the light source and the stage for causing the measuring light to impinge on the photomask, a second optical device disposed between the stage and the transmission detector for causing the measuring light passing through the photomask to impinge on the transmission detector, and a controller having a dimension-deciding algorithm to determine a dimension of the circuit patterns from a spectroscopic characteristic of the received measuring light, the controller being connected to the transmission detector.

According to an embodiment of the present invention, a method for measuring a dimension of a photomask comprises preparing design data indicating locations of circuit patterns of a photomask, fabricating the photomask using the design data, transmitting a measuring light to the photomask, measuring a spectroscopic characteristic of the transmitted measuring light, preparing spectrum-dimension data indicating a relationship between an expected spectroscopic characteristic of the transmitted measuring light and a dimension of the circuit patterns by using the design data, and comparing the measured spectroscopic characteristic of the transmitted measuring light with the spectrum-dimension data to determine a dimension of the circuit patterns at a region where the measuring light is transmitted.

According to an embodiment of the present invention, a method for measuring a dimension of a photomask comprises preparing design data indicating locations of circuit patterns of the photomask, fabricating the photomask by using the design data, splitting a measuring light having a wavelength into a transmitted light transmitted to the photomask and a standard light not transmitted to the photomask, comparing intensities of the transmitted light and the standard light to determine a transmissivity of the transmitted light, preparing density-dimension data indicating a relationship between density and dimension of the circuit patterns by using the design data, preparing spectrum-density data indicating a relationship between an expected transmissivity of the transmitted light and the density of the circuit patterns, preparing spectrum-dimension data indicating a relationship between the expected transmissivity of the transmitted light and the dimension of the circuit patterns by using the density-dimension data and the spectrum-density data, and comparing the transmissivity of the transmitted light with the spectrum-dimension data to determine the dimension of the circuit patterns at a region where the transmitted light is transmitted.

BRIEF DESCRIPTION OF THE DRAWINGS

Preferred embodiments of the present disclosure can be understood in more detail from the following descriptions taken in conjunction with the accompanying drawings in which.

DETAILED DESCRIPTION OF EXEMPLARY EMBODIMENTS

Figure 1:
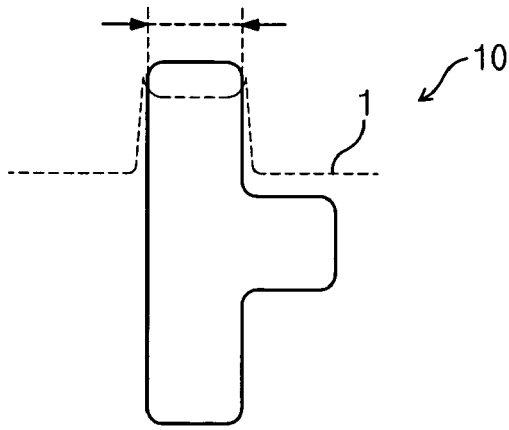
FIG. 1 is a diagram for explaining a conventional method for measuring the dimension of patterns using an image.
Figure 2:
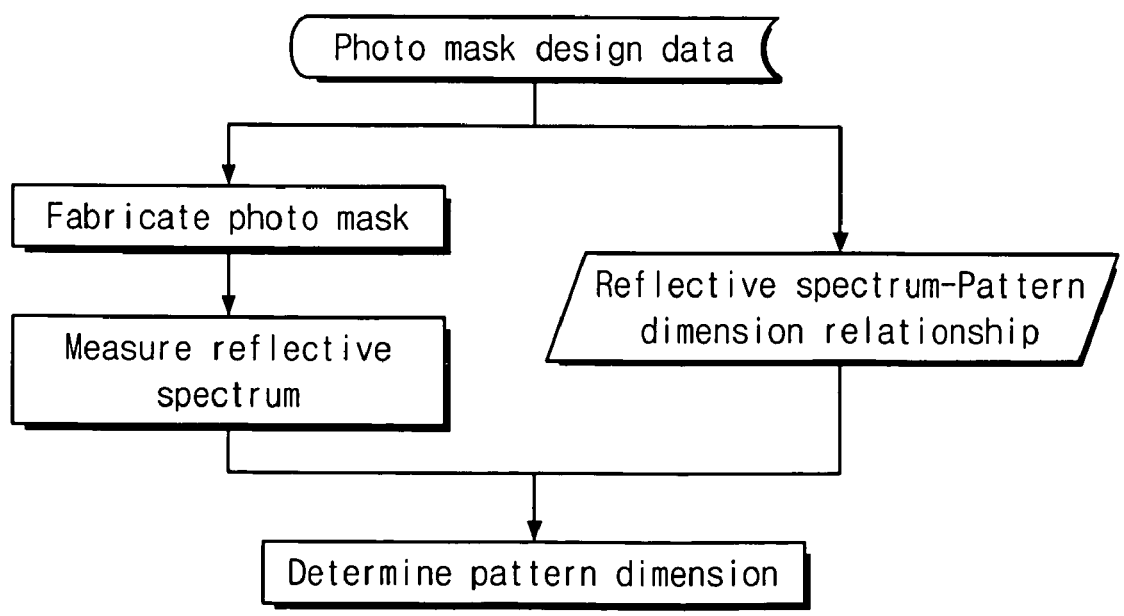
FIG. 2 is a flowchart for explaining a conventional method for measuring the dimension of patterns using a reflective spectrum.
Figure 3:
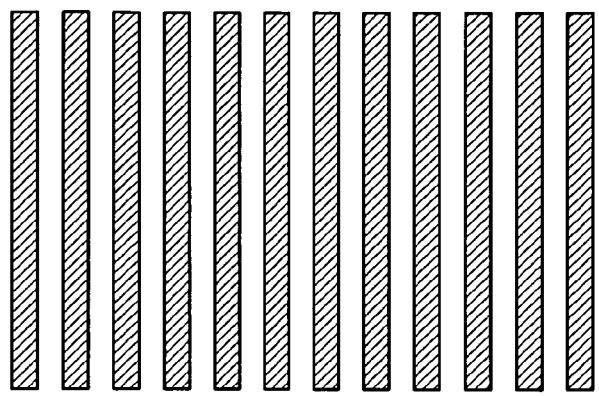
FIG. 3 through FIG. 5 are top plan views of various patterns formed on a photomask.
Figure 4:
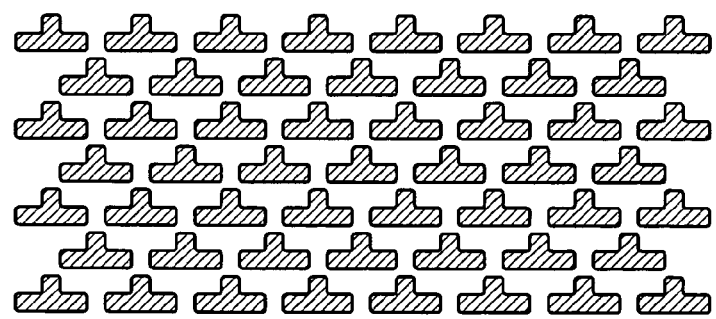
Figure 5:
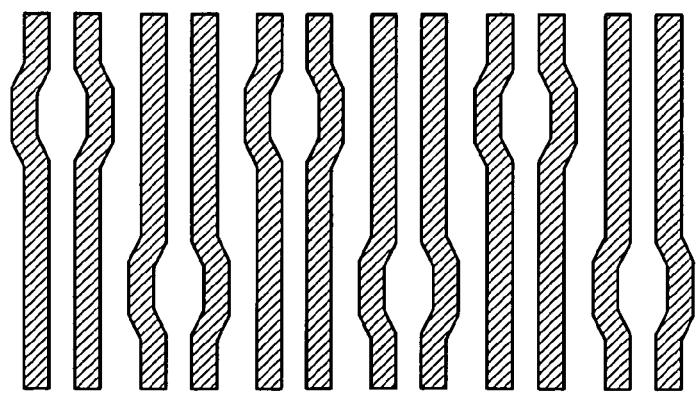

Exemplary embodiments of the present invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the height of layers and regions are exaggerated for clarity. It will also be understood that when a layer is referred to as being "on" another layer or substrate, it can be directly on the other layer or substrate, or intervening layers may also be present.

Figure 6:
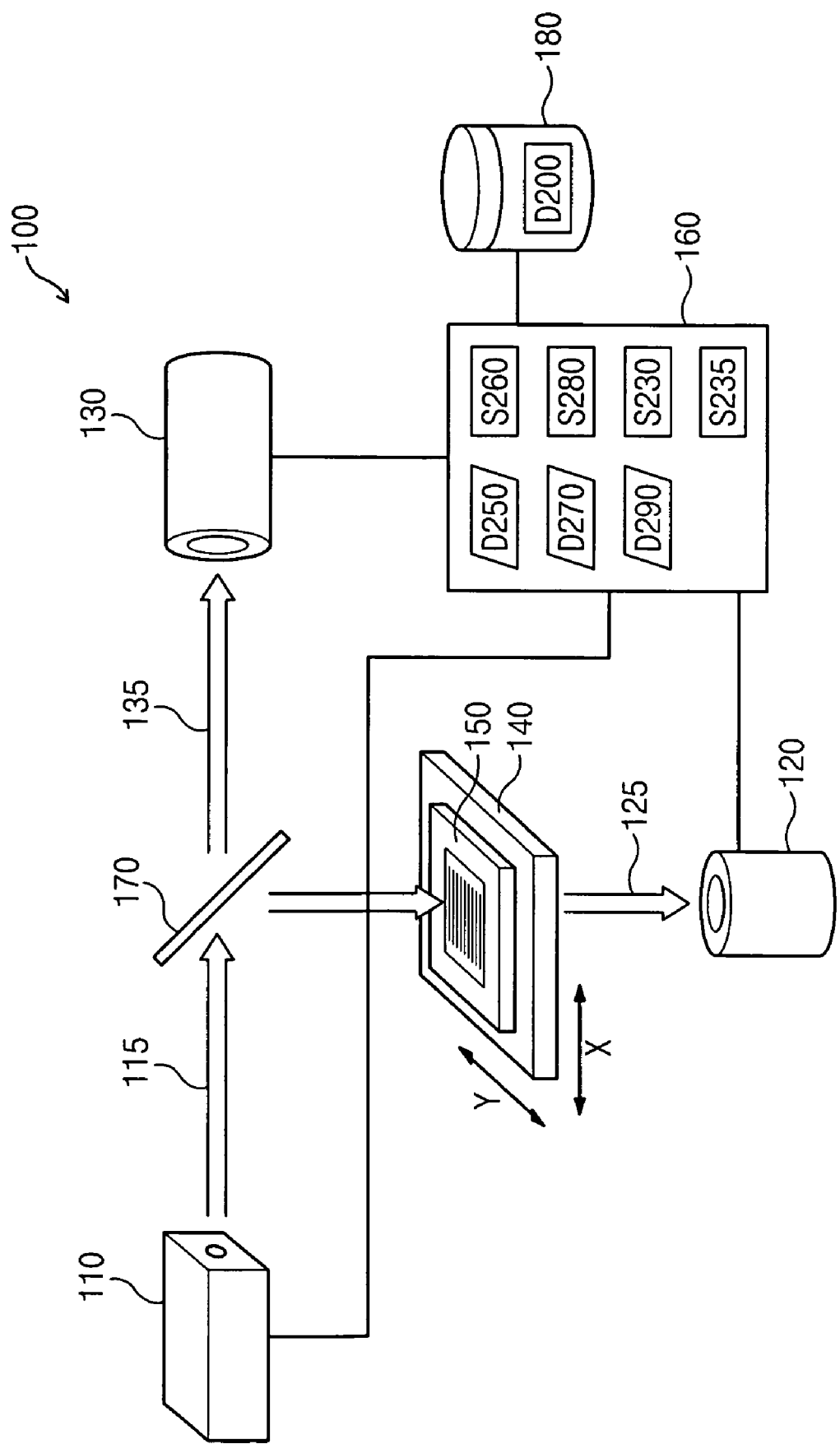
FIG. 6 shows a pattern-dimension measuring system according to an embodiment of the present invention.

FIG. 6 shows a system 100 for measuring a pattern dimension of a photomask according to an embodiment of the present invention. The system 100 includes a light source 110 for generating measuring light 115 having a wavelength and a stage 140 on which a photomask 150 is placed. A beam splitter 170 is positioned between the light source 110 and the stage 140. The beam splitter 170 splits the measuring light 115 emitted from the light source 110 into transmitted light 125 and standard light 135. The transmitted light 125 has a transmission path through the photomask 150, and the standard light 135 has a standard path which does not pass to the photomask 150.

The measuring light 115 has a wavelength of about 0.001 nanometers to about 500 nanometers. Light having a bandwidth, not a single wavelength, can be used as the measuring light 115. In an embodiment of the present invention, the measuring light 115 uses a deep ultraviolet (DUV) having a bandwidth. The beam splitter 170 can be a half-silvered mirror. The transmitted light 125 uses light that is reflected from the beam splitter 170, and the standard light 135 uses light that passes through the beam splitter 170. The stage 140 is configured for moving relative to the transmitted light 125. For example, the stage 140 moves on an X, Y plane which is perpendicular to the transmitted light 125.

A transmission detector 120 is disposed below the photomask 150 to measure the transmitted light 125. That is, the transmission detector 120 is disposed on the transmission path of the transmitted light 125. A standard detector 130 is disposed on the standard light transmission path to measure the standard light 135 passing the beam splitter 170. The transmission detector 120 and the standard detector 130 measure intensities of the transmitted light 125 and the standard light 135, respectively.

The detectors 120 and 130 are electronically connected to a controller 160 having algorithms for processing predetermined data and the data received from the transmission detector 120 and the standard detector 130. According to embodiments of the present invention, density-dimension data D250, spectrum-density data D270, and spectrum-dimension data D290 are stored in the controller 160. The density-dimension data D250 indicates a relationship between a density and a dimension of circuit patterns formed on a photomask. The spectrum-density data D270 indicates a relationship between a spectroscopic characteristic of the transmitted light 125 and a density of the circuit patterns. The spectrum-dimension data D290 indicates a relationship between the spectroscopic characteristic of the transmitted light 125 and the dimension of the circuit patterns.

According to an embodiment of the present invention, the controller 160 has a density-dimension algorithm S260, a spectrum-dimension algorithm S280, and a dimension-deciding algorithm S230. The density-dimension algorithm S260 indicates a procedure for extracting the density-dimension data D250 from design data D200 that is used to indicate locations of the circuit patterns. The design data D200 may be stored in a separate memory 180. The spectrum-dimension algorithm S280 indicates a procedure for generating the spectrum-dimension data D290 from the density-dimension data D250 and the spectrum-density data D270. The dimension-deciding algorithm S230 indicates a series of processing procedures including a procedure for comparing the measured spectroscopic characteristic of the transmitted light 125 with the spectrum-dimension data D290.

Preferably, the spectroscopic characteristic of the transmitted light 125, which is compared in the dimension-deciding algorithm S230, is a transmissivity T of the transmitted light 125. For this, the controller 160 further has a transmissivity determination algorithm S235 including a procedure for comparing a light intensity measured by the transmission detector 120 with a light intensity measured by the standard detector 130 to determine the transmissivity T of the transmitted light 125. According to embodiments of the present invention, the transmissivity T of the transmitted light 125 is used for the spectroscopic characteristic in the spectrum-density data D270 and the spectrum-dimension data D290.

Figure 7:
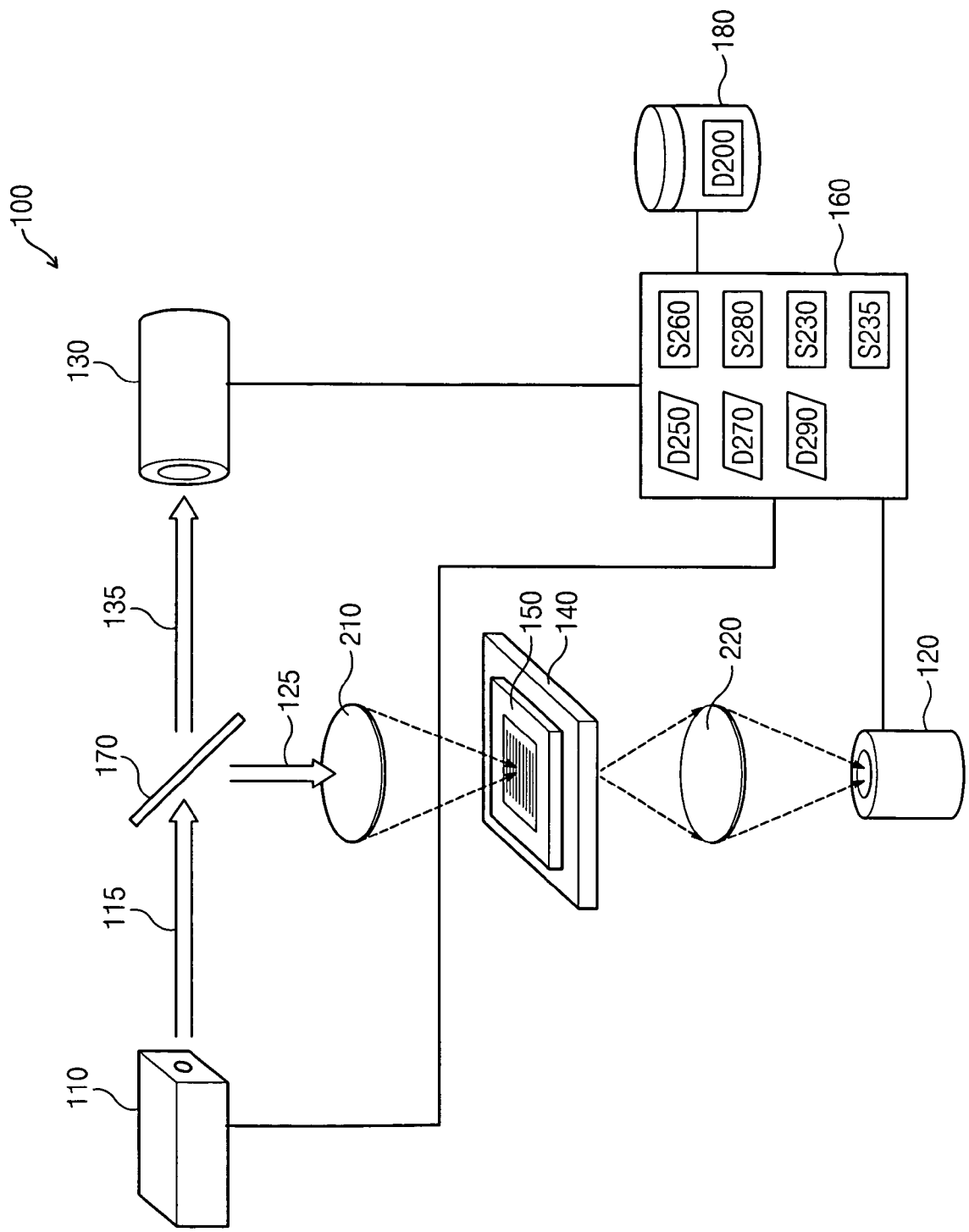
FIG. 7 shows a pattern-dimension measuring system according to an embodiment of the present invention.

FIG. 7 shows a pattern-dimension measuring system 100 according to an embodiment of the present invention. The system 100 includes a first lens assembly 210 and a second lens assembly 220 on a path of transmitted light 125 passing through a photomask 150. Each of the first and second lens assemblies 210 and 220 includes at least one lens. The transmitted light 125 impinges on the photomask 150 through the first lens assembly 210. After passing through the photomask 150, the transmitted light 125 impinges on a transmission detector 120 via the second lens assembly 220.

As illustrated, the transmitted light 125 is refracted by the first lens assembly 210 to impinge on the photomask 150 in the form of a point light. That is, the light passing through the first lens assembly 210 is focused on a measuring point of the photomask 150. After passing through the photomask 150, the transmitted light 125 is re-refracted by the second lens assembly 220 to impinge on the transmission detector 120. Such a point-light impingement method is used to measure a part of uniform patterns formed on a photomask. A general pattern shape may be estimated using the point-light impingement method.

Figure 8:
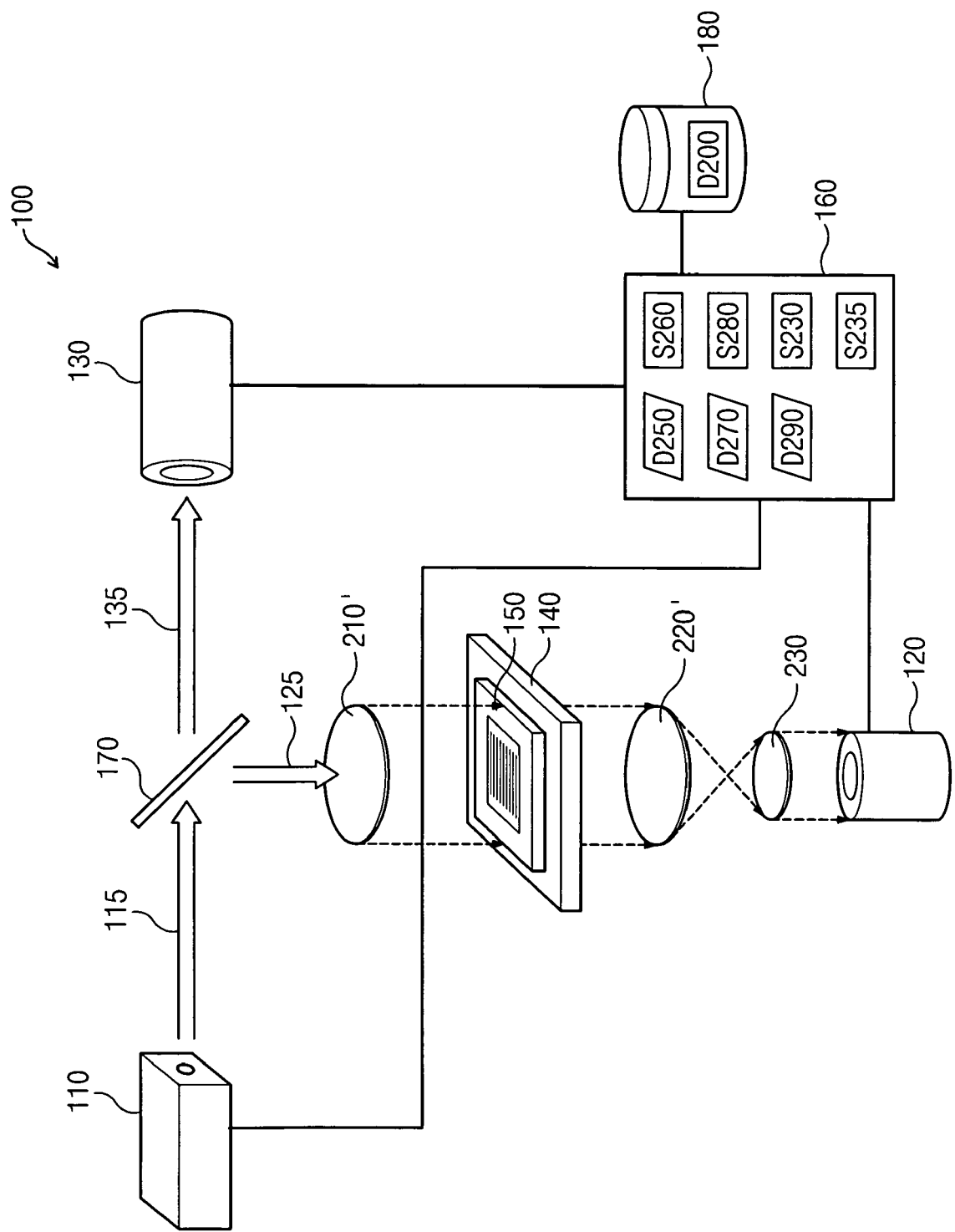
FIG. 8 shows a pattern-dimension measuring system according to an embodiment of the present invention.

FIG. 8 shows a pattern-dimension measuring system 100 according to an embodiment of the present invention. The system 100 includes a first lens assembly 210', a second lens assembly 220', and a third lens assembly 230 on a path of transmitted light passing through a photomask 150. Each of the first, second, and third lens assemblies 210', 220', and 230 includes at least one lens. Transmitted light 125 is applied to the photomask 150 after passing through the first lens assembly 210'. The transmitted light 125 passing through the photomask 150 impinges on a transmission detector 120 via the second and third lens assemblies 220' and 230.

The transmitted light 125 passing through the first lens assembly 210' impinges on the photomask 150 in the form of surface light. The transmitted light 125 can be controlled as surface light having a size enough to fully illuminate an entire area of the photomask 150. The transmitted light 125 passing through the photomask 150 impinges on the transmission detector 120 via the second and third lens assemblies 220' and 230. After passing through the photomask 150, the transmitted light (i.e., surface light) 125 is controlled by the second and third lens assemblies 220' and 230 to be transmitted to the transmission detector 120. To readily detect the transmitted surface light 125, the transmission detector 120 may include an image sensor (not shown). The image sensor receives light and converts the received light into an electrical signal and converts the electrical signal into a voltage. The image sensor includes, for example, charge coupled device (CCD) image sensors and complementary metal oxide semiconductor (CMOS) image sensors. Since the transmitted surface light 125 can be sensed by the image sensor, images are obtained to readily get intensity of a transmitted light.

The surface-light impingement method according to an embodiment of the present invention is used to measure many points of complex patterns formed on a photomask. That is, since photomask patterns may be obtained as images, the surface-light impingement method can be used as an alternative to a point-light impingement method.

A pattern dimension measuring method according to an embodiment of the present invention will now be described with reference to a flowchart of FIG. 9.

Figure 9:
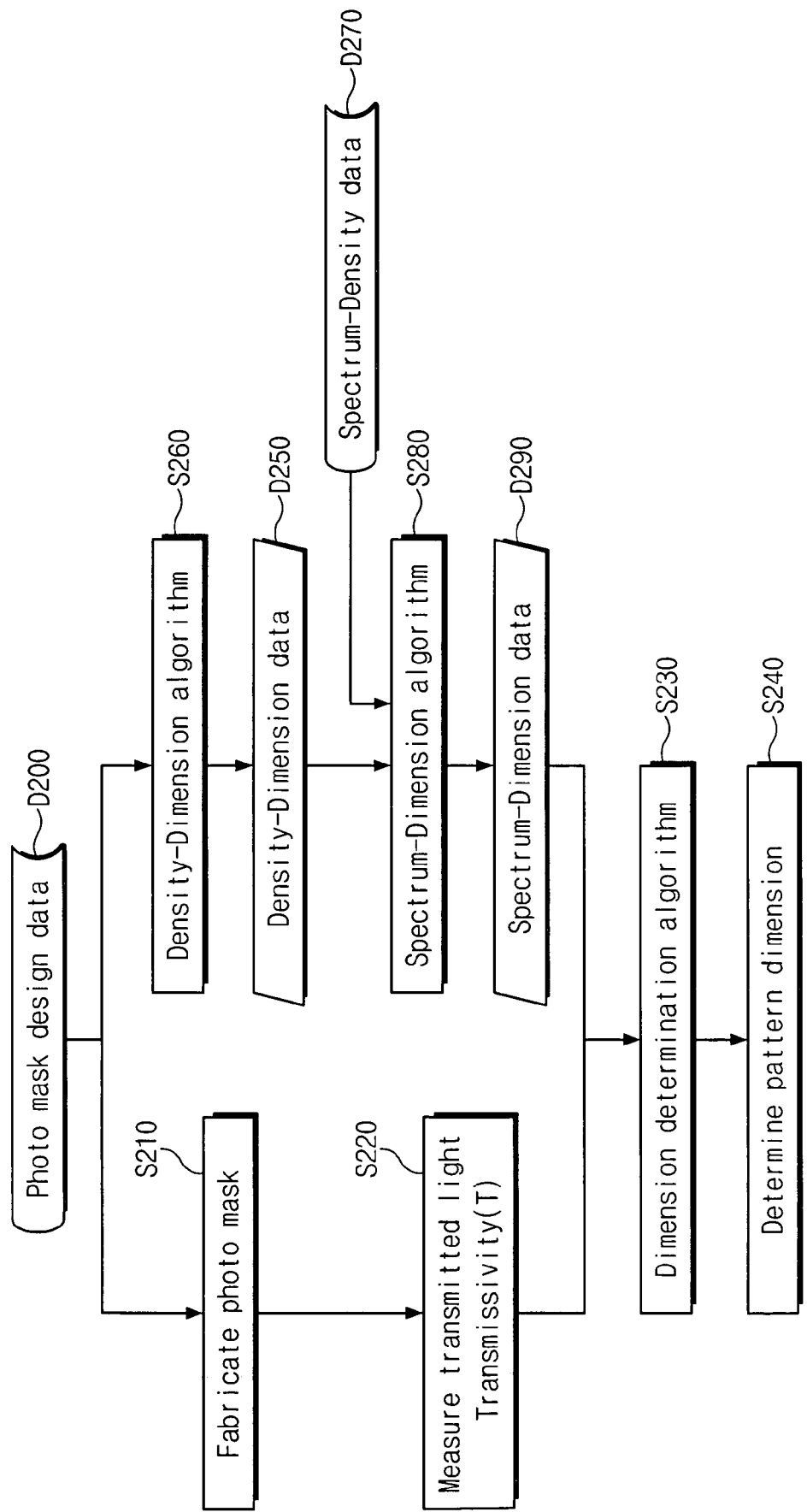
FIG. 9 is a flowchart for explaining a pattern dimension measuring method according to an embodiment of the present invention.

Referring to FIG. 9, circuit patterns of semiconductor products are designed using a computer program such as, for example, CAD or OPUS. The designed circuit patterns are stored in a memory as electronic data D200. The design data D200 indicates locations of circuit patterns formed on a photomask substrate. The design data D200 is used to fabricate a photomask 150 (shown in FIG. 8) where the mask patterns are formed (S210). The fabricating procedure of the photomask 150 includes an exposing process, a developing process, and an etching process.

In the photomask fabricating procedure S210, to extract exposure data for the exposing process, the design data D200 is stored in a computer having data processing programs. An exposing process is performed to irradiate a region of a photoresist layer formed on the photomask substrate. Conventionally, a quartz substrate is used as the photomask substrate and electronic beam or laser is used as an irradiative source of the exposing process. In the exposing process, the irradiated region is determined by the exposure data.

The exposed photoresist layer is developed to form a photoresist pattern exposing an underlying mask layer. The mask layer is made of, for example, at least one selected from the group consisting of chrome (Cr), molybdenum silicide (MoSi), transition metallic nitride of group IV transition metallic nitride of group V, transition metallic nitride of group VI, and silicon nitride. Using the photoresist pattern as an etch mask, the exposed mask layer is etched to form circuit patterns. After the photoresist pattern is removed to expose a top surface of the circuit patterns, the photomask 150 where the circuit patterns are formed is cleaned.

A measuring process for measuring the dimension of the circuit patterns is performed on the photomask 150 where the circuit patterns are formed (S220). The measuring process (S220) includes transmitting measuring light 115 (which is divided by a beam splitter 170 into transmitted light 125 and standard light 135) having a wavelength to a region of the photomask 150 and measuring a spectroscopic state of the transmitted light 125. The measuring light 115 may use light having a wavelength of about 0.001 nanometers to about 500 nanometers and may use deep ultraviolet (DUV), as described above with reference to FIG. 6. To enhance precision (which will be described below with reference to FIG. 10), the measuring light 115 preferably uses light having a bandwidth. According to an embodiment of the present invention, the measuring light 115 comprises DUV having a bandwidth.

According to embodiments of the present invention, a transmissivity T of the measuring light 115 is used in determining the dimension of the circuit patterns. The transmissivity T refers to a ratio of an intensity of light impinging on the photomask 150 to an intensity of light transmitted to the photomask 150. To measure the transmissivity T more precisely, the measuring light 115 is divided by a beam splitter 170 into transmitted light 125 having a path which is transmitted to the photomask 150 and standard light 135 having a path which does not transmit to the photomask 150.

If the system 100 including the beam splitter 170 does not change in configuration, a ratio of an intensity of the standard light 135 to an intensity of the transmitted light 125 can be regularly maintained. That is, an intensity of light impinging on the photomask 150 has a regular ratio to the intensity of the standard light 135. Thus, an intensity of light transmitted to the photomask 150 (i.e., the transmitted light 125 measured at the transmission detector 120) is compared with the intensity of the standard light 135 to measure a transmissivity of the transmitted light 125 more readily and precisely. The procedure of comparing the intensities of the lights to determine the transmissivity can be conducted using a transmission determination algorithm S235 embedded in a controller.

The measured spectroscopic state of the transmitted light 125 is used to determine the dimension of circuit patterns disposed at a region to which the transmitted light 125 is transmitted. The above determination procedure is indicated by a dimension-deciding algorithm S230 which includes comparing the measured spectroscopic state of the transmitted light 125 and spectrum-dimension data D290. The spectrum-dimension data D290 indicates a relationship between the dimension of the patterns and a predicted spectroscopic state of the transmitted light 125.

Preparing the spectrum-dimension data D290 includes processing density-dimension data D250 and spectrum-density data D270 using a spectrum-dimension algorithm S280. The density-dimension data D250 indicates a relationship between the density and dimension of the circuit patterns, and the spectrum-density data D270 indicates a relationship between a spectroscopic characteristic of the transmitted light and the density of the circuit patterns.

The density-dimension data D250 is extracted from the design data D200 using the density-dimension algorithm S260. That is, the density-dimension algorithm S260 includes using the design data D200 to determine a pattern density at a predetermined region. The extraction of the density-dimension data D250 using the density-dimension algorithm S260 may be conducted using a simulation program such as TOPO or Solid-C.

A transmission of the transmitted light 125 is determined by a pattern density at a measurement region because the photomask 150 determines a spectrum-transmittable region. Thus, the transmissivity T may be expressed as a function of a pattern density "$\rho$" at a measurement region.

Figure 10:
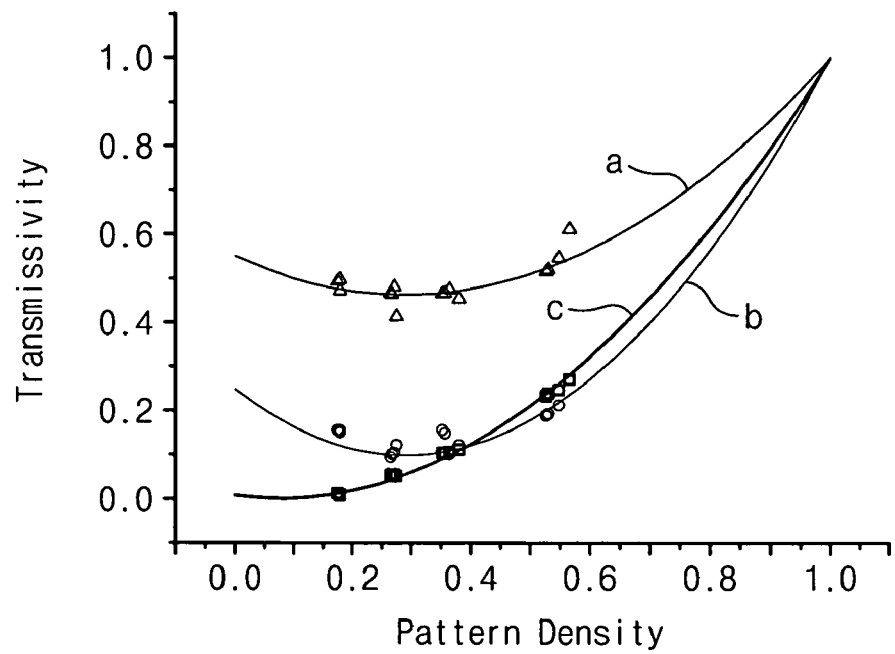
FIG. 10 is a transmissivity-pattern density graph showing measuring results using a measuring method according to an embodiment of the present invention.

FIG. 10 is a graph illustrating a test result of the transmissivity T measured according to an embodiment of the present invention. The test was performed using photomasks having different shapes. In the graph, an x-axis denotes a pattern density "$\rho$" and a y-axis denotes a measured transmissivity T. Since the measured circuit patterns have different shapes, they have various pattern densities.

According to the measured result, a correlation between the transmissivity T and the pattern density "$\rho$" is shown. Such a correlation may be quantitatively analyzed using theoretical or empirical approaches. For example, the correlation may be analyzed using theoretical analysis based on electromagnetics or a predetermined model obtained by empirical analysis using an interpolation. That is, the transmissivity T may be expressed as the function of the pattern density "$\rho$": $T \sim T(\rho)$.

In the above-described test, light having different wavelengths is used as the transmitted light 125, and reference symbols "a, b, and c" represent light having wavelengths of 633 nanometers, 365 nanometers, and 193 nanometers, respectively. A table [Table 1] shows a calculation result of $R^2$ which denotes the amount of the measured data of a model obtained by analyzing the three groups. When a value of the $R^2$ approaches 1, it is understood that a model describes measured data accurately. Referring to the table [Table 1], if a wavelength "c" (193 nanometers) of DUV is used, the value of the $R^2$ is close to 1. As the wavelength increases greater than "c", the $R^2$ has a value going away from 1. This result shows that light having a shorter wavelength than DUV can be used as the transmitted light.

TABLE 1

| Wavelength (nm) | $R^2$ |
| --- | --- |
| 193 | 0.999 |
| 365 | 0.838 |
| 633 | 0.801 |

Since the transmissivity T may be expressed as the function of only the pattern density "$\rho$", it may be described independent of the shapes of the patterns. Thus, the pattern dimension determined using the spectrum-density data D270 is also independent of the shapes of the patterns. The measured pattern dimension may be determined independent of the shapes of the patterns.

Figure 11:
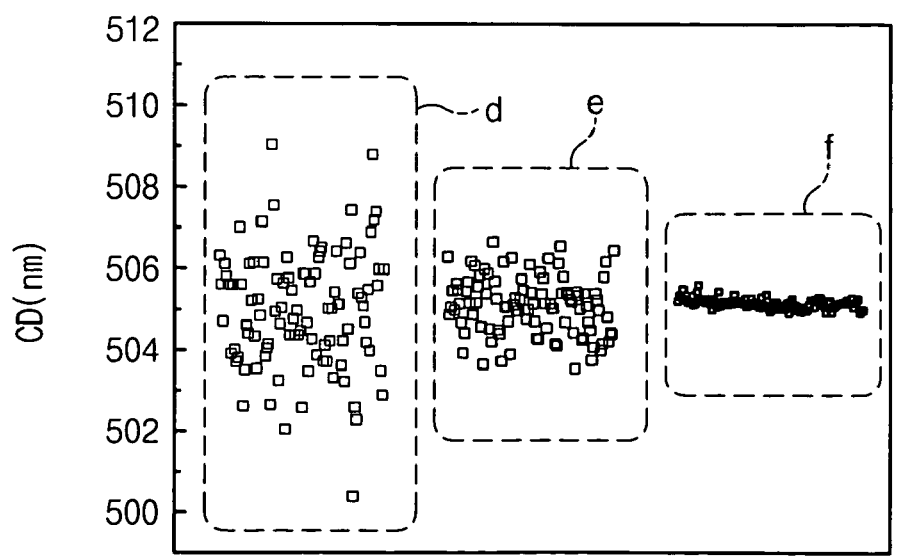
FIG. 11 is a dimension graph showing measuring results using measuring methods according to embodiments of the present invention.

FIG. 11 is a graph illustrating a result of a test performed for estimating a precision of measurement using a measuring method according to an embodiment of the present invention. The test used a scanning electron microscope "d" and DUV "e" having a wavelength of 193 nanometers and DUV "f" having a wavelength band of 193-230 nanometers as the transmitted light to measure a region of a photomask. Further, a table [Table 2] shows a standard deviation "$3\sigma$" of three data groups "d, e, and f" of the test.

TABLE 2

| Measuring Manner | $3\sigma$ |
| --- | --- |
| DUV band (190-230 nm) | 0.37 nm |
| DUV (193 nm) | 2.1 nm |
| SEM | 4.3 nm |

According to the test result, a pattern dimension measuring manner using a DUV band as a transmitted light has a precision 10 times higher than a pattern dimension measuring manner using an SEM. The pattern dimension measuring manner using the DUV band has a still higher precision than a pattern dimension measuring manner using DUV of a single wavelength. The difference of the standard deviations occurs because a noise generated in the manner using the DUV band is smaller than a noise generated in the manner using the DUV.

Since an embodiment of the present invention does not use an image but uses a spectrum of a transmitted light, the dimension is not a local dimension measured at a specific location of the circuit pattern but a global dimension of patterns disposed at a specific region. Since a linewidth uniformity of the photomask exhibits a degree of size variation with points, the global dimension measuring method according to an embodiment of the present invention may also be employed as a test method of a linewidth uniformity.

Since an embodiment of the present invention adopts a spectroscopic method, the problems of a long measuring time (in the case that an SEM is used) and reduction in yield as well as restraint in resolution indicating a limitation of measurement (in the case that an image is used) can be solved. Therefore, more effective and precise methods of testing a linewidth uniformity of a photomask can be achieved.

According to an embodiment of the present invention, the dimension of patterns formed on a photomask is determined using a transmissive spectroscopic method being independent of pattern shapes, which is faster and more economical to measure the pattern dimension of a photomask than a conventional method using a scanning electron microscope (SEM). More particularly, embodiments of the present invention use measured transmissive spectroscopic characteristics, which are independent of pattern shapes. Accordingly, there is no procedure of securing separate empirical data to determine dependency on pattern shapes. As a result, a linewidth uniformity of the photomask may be tested faster and more economically than conventional methods. Since a pattern dimension measuring method according to an embodiment of the present invention does not use images, there is no restraint in image resolution. Therefore, it is possible to measure the dimension of finer patterns.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention.

What is claimed is:

1. A system for measuring a dimension of photomasks, comprising:
   a light source emitting a measuring light having a predetermined wavelength;
   a transmission detector for receiving the measuring light;
   a stage on which a photomask having circuit patterns is placed, the stage being disposed between the light source and the transmission detector; and
   a controller having a dimension-deciding algorithm to determine a dimension of the circuit patterns from a spectroscopic characteristic of the received measuring light transmitted through the photomask, the controller being connected to the transmission detector, wherein the controller includes:
      density-dimension data indicating a relationship between density and dimension of the circuit patterns; and
      a density-dimension algorithm for extracting the density-dimension data, wherein the controller is connected to a memory for storing design data indicating locations of the circuit patterns, and the density-dimension algorithm extracts the density-dimension data from the design data.

2. The system as claimed in claim 1, wherein the controller further includes:
   spectrum-density data indicating a relationship between an expected spectroscopic characteristic of the measuring light and the density of the circuit patterns; and
   spectrum-dimension data indicating a relationship between the expected spectroscopic characteristic of the measuring light and the dimension of the circuit patterns,
   wherein the dimension-deciding algorithm includes comparing a measured spectroscopic characteristic of the measuring light with the spectrum-density data.

3. The system as recited in claim 2, wherein the controller further includes:
   a spectrum-dimension algorithm for generating the spectrum-dimension data from the density-dimension data and the spectrum-density data.

4. The system as claimed in claim 1, wherein the light source emits deep ultraviolet (DUV) light having a bandwidth.

5. A system for measuring a dimension of photomasks, comprising:
   a light source emitting a measuring light having a predetermined wavelength;
   a transmission detector for receiving the measuring light;
   a stage on which a photomask having circuit patterns is placed, the stage being disposed between the light source and the transmission detector;
   a controller having a dimension-deciding algorithm to determine a dimension of the circuit patterns from a spectroscopic characteristic of the received measuring light, the controller being connected to the transmission detector;
   a beam splitter positioned between the light source and the stage to split the measuring light into a transmitted light and a standard light; and
   a standard detector for receiving the standard light, wherein the beam splitter reflects the transmitted light in a direction of the photomask, and the standard detector is electrically connected to the controller.

6. A system for measuring a dimension of photomasks, comprising:
   a light source emitting a measuring light having a wavelength;
   a transmission detector for receiving the measuring light;
   a stage on which a photomask having circuit patterns is placed, the stage being disposed between the light source and the transmission detector;
   a first optical device disposed between the light source and the stage for causing the measuring light to impinge on the photomask;
   a second optical device disposed between the stage and the transmission detector for causing the measuring light passing through the photomask to impinge on the transmission detector; and
   a controller having a dimension-deciding algorithm to detennine a dimension of the circuit patterns from a spectroscopic characteristic of the received measuring light transmitted through the photomask, the controller being connected to the transmission detector,
   wherein the first optical device causes the measuring light to impinge on the photomask in the form of a surface light.

7. The system as claimed in claim 6, wherein the transmission detector is an image sensor.

8. A method for measuring a dimension of a photomask, comprising:
   preparing design data indicating locations of circuit patterns of a photomask;
   fabricating the photomask using the design data; transmitting a measuring light having a wavelength through the photomask;
   measuring a spectroscopic characteristic of the transmitted measuring light;
   preparing spectrum-dimension data indicating a relationship between an expected spectroscopic characteristic of the transmitted measuring light and a dimension of the circuit patterns by using the design data; and
   comparing the measured spectroscopic characteristic of the transmitted measuring light with the spectrum-dimension data to determine the dimension of the circuit patterns at a region to which the measuring light is transmitted, wherein transmitting the measuring light to the photomask comprises:

splitting the measuring light into a transmitted light transmitted to the photomask and a standard light not transmitted to the photomask; and comparing intensities of the standard light and the transmitted light for measuring transmissivity.

9. The method as claimed in claim 8, wherein the measuring light is deep ultraviolet (DUV) light having a bandwidth.

10. The method as recited in claim 8, wherein measuring the spectroscopic characteristic of the transmitted measuring light comprises: measuring a transmissivity of the measuring light transmitted to the photomask.

11. The method as claimed in claim 8, wherein preparing the spectrum-dimension data comprises:

preparing density-dimension data indicating a relationship between density and dimension of the circuit patterns by using the design data;

preparing spectrum-density data indicating a relationship between an expected spectroscopic characteristic of the transmitted measuring light and the density of the circuit patterns; and processing the density-dimension data and the spectrum-density data using a spectrum dimension algorithm.

12. The method as claimed in claim 11, wherein the spectrum-density data is independent of shapes of the circuit patterns.

13. A method for measuring a dimension of a photomask, comprising:

preparing design data indicating locations of circuit patterns of a photomask;

fabricating the photomask using the design data; transmitting a measuring light having a wavelength through the photomask;

measuring a spectroscopic characteristic of the transmitted measuring light;

preparing spectrum-dimension data indicating a relationship between an expected spectroscopic characteristic of the transmitted measuring light and a dimension of the circuit patterns by using the design data; and comparing the measured spectroscopic characteristic of the transmitted measuring light with the spectrum-dimension data to determine the dimension of the circuit patterns at a region to which the measuring light is transmitted wherein preparing the spectrum-dimension data comprises:

preparing density-dimension data indicating a relationship between density and dimension of the circuit patterns by using the design data;

preparing spectrum-density data indicating a relationship between an expected transmissivity of the measuring light and the density of the circuit patterns; and processing the density-dimension data and the spectrum-density data using a spectrum dimension algorithm to prepare spectrum-dimension data indicating a relationship between the expected transmissivity of the measuring light and the dimension of the circuit patterns.

14. The method as claimed in claim 11, wherein determining the dimension of the circuit patterns comprises comparing a transmissivity of the measuring light with the spectrum-dimension data.

15. A method for measuring a dimension of a photomask, comprising:

preparing design data indicating locations of circuit patterns of the photomask;

fabricating the photomask by using the design data; splitting a measuring light having a wavelength into a transmitted light transmitted through the photomask and a standard light not transmitted to the photomask;

comparing intensities of the transmitted light and the standard light to determine a transmissivity of the transmitted light;

preparing density-dimension data indicating a relationship between density and dimension of the circuit patterns by using the design data; preparing spectrum-density data indicating a relationship between an expected transmissivity of the transmitted light and the density of the circuit patterns;

preparing spectrum-dimension data indicating a relationship between the expected transmissivity of the transmitted light and the dimension of the circuit patterns by using the density-dimension data and the spectrum-density data; and comparing the transmissivity of the transmitted light with the spectrum-dimension data to determine a dimension of the circuit patterns at a region where the transmitted light is transmitted.

16. The method as claimed in claim 15, wherein the measuring light is deep ultraviolet (DUV) light having a bandwidth.

17. The method as claimed in claim 15, wherein the spectrum-density data is independent of shapes of the patterns.

* * * * *